United States Patent
Liu et al.

(10) Patent No.: US 10,146,127 B2
(45) Date of Patent: Dec. 4, 2018

(54) SPACER AND MANUFACTURING DEVICE FOR THE SAME

(71) Applicant: Shenzhen China Star Optoelectronics Technology Co., Ltd., Shenzhen, Guangdong (CN)

(72) Inventors: Huan Liu, Guangdong (CN); Zui Wang, Guangdong (CN); Jinbo Guo, Guangdong (CN); Shih-hsun Lo, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 15/944,907

(22) Filed: Apr. 4, 2018

(65) Prior Publication Data

US 2018/0231886 A1  Aug. 16, 2018

Related U.S. Application Data

(62) Division of application No. 14/888,418, filed on Oct. 30, 2015, now Pat. No. 9,946,154.

(51) Int. Cl.
*G03F 7/20* (2006.01)
*G02F 1/1339* (2006.01)
(Continued)

(52) U.S. Cl.
CPC .............. *G03F 1/70* (2013.01); *G03F 1/36* (2013.01); *G03F 1/78* (2013.01); *G03F 7/0005* (2013.01);
(Continued)

(58) Field of Classification Search
CPC ..... G03F 1/00; G03F 1/50; G03F 1/54; G03F 7/20; G03F 7/2002; G03F 7/70; G03F 7/70283; G02F 1/13394
(Continued)

(56) References Cited

U.S. PATENT DOCUMENTS

| 2005/0190336 A1* | 9/2005 | Chen | G02F 1/13394 |
| | | | 349/155 |
| 2007/0159584 A1* | 7/2007 | Sato | G02B 5/201 |
| | | | 349/129 |

(Continued)

FOREIGN PATENT DOCUMENTS

KR  2004-0104799 A  * 12/2004

OTHER PUBLICATIONS

Computer-generated translation of KR 2004-0104799 (Dec. 2004) (Year: 2004).*

*Primary Examiner* — John A McPherson
(74) *Attorney, Agent, or Firm* — Andrew C. Cheng

(57) ABSTRACT

A spacer manufacturing device is disclosed. The device includes a photo mask having a central light-transmitting region and a peripheral light-transmitting region disposed at a periphery of the central light-transmitting region; and an exposure device right opposite to the photo mask. Light emitted from the exposure device is irradiated to a negative photoresist material after passing through the photo mask, the light intensity passing through the peripheral light-transmitting region is less than the light intensity passing through the central light-transmitting region. A spacer is also disclosed. Only one exposure process is required to realize the spacer having a convex-shaped cross section. The process is simple and the manufacturing cost is low. At the same time, flatness of the convex shoulder of the spacer having a convex-shaped cross section is adjustable, which can satisfy the requirement for manufacturing spacers having different specifications.

6 Claims, 6 Drawing Sheets

(51) Int. Cl.
*G03F 1/70* (2012.01)
*G03F 1/78* (2012.01)
*G03F 1/36* (2012.01)
*G03F 7/00* (2006.01)

(52) U.S. Cl.
CPC ...... *G03F 7/70283* (2013.01); *G02F 1/13394* (2013.01)

(58) Field of Classification Search
USPC .............................. 430/5, 320, 321; 349/156
See application file for complete search history.

(56) References Cited

U.S. PATENT DOCUMENTS

2007/0247574 A1* 10/2007 Kudo ................ G02F 1/133555
349/114
2008/0291384 A1* 11/2008 Koyama ............. G02F 1/13394
349/155
2008/0291385 A1* 11/2008 Aizawa ............... G02F 1/13394
349/157

\* cited by examiner

SPACER AND MANUFACTURING DEVICE FOR THE SAME

CROSS REFERENCE TO RELATED APPLICATIONS

This is a continuation application of co-pending patent application Ser. No. 14/888,418, filed on Oct. 30, 2015, which is a national stage of PCT Application Number PCT/CN2015/090812, filed on Sep. 25, 2015, claiming foreign priority of Chinese patent application number 201510583558.1, filed on Sep. 14, 2015.

BACKGROUND OF THE INVENTION

1. Field of the Invention

The present invention relates to a spacer for a liquid crystal panel, and more particularly to a spacer and a manufacturing device for the same.

2. Description of Related Art

With the development of the display technology, a liquid crystal panel is widely applied. However, the liquid crystal panel is formed by injecting liquid crystal molecules between an array substrate and a color filter substrate. The structure of the liquid crystal panel decides that when an external temperature is changed, a material expansion or a material shrinkage of the glass substrate and the liquid crystal molecules. Besides, the liquid crystal product usually suffers an external force impact such as a touch so that a misalignment of the substrates of the liquid crystal display panel is easily generated so as to cause a light leakage problem of the panel. Accordingly, adverse impacts of the display effect such as wrong display colors or bad display effect is generated.

In order to increase a supporting effect at a periphery region of the liquid crystal display device, and preventing the liquid crystal display device from generating a deformation in a later module process by an external force, in the known art, protruding cylindrical post spacers (PS) are disposed on the color filter substrate in order to support a gap between the array substrate and the color filter substrate so as to maintain a uniform cell thickness. The post spacers can be divided into main post spacers and sub post spacers. A height of the main post spacer is higher than a height of the sub spacer. After the array substrate and the color filter substrate are bonded, the main post spacers abut against the array substrate, and the sub post spacers do not abut against the array substrate. The main spacers support the liquid crystal panel in a normal working environment. When an external pressure applied on the liquid crystal panel is too large, the sub post spacers can abut against the array substrate in order to increase an entire supporting strength.

The structure of the main post spacer and the sub post spacer is a prismatic platform or a prismatic column, which has a trapezoidal cross section. The main post spacers support the array substrate and the sub post spacers are floating to realize an auxiliary supporting function. However, in the above design, the main post spacer and the sub post spacer are manufactured independently. When surface manufacturing methods for the main post spacer and the sub post spacer are different, the roughness is different. A level difference between the main post spacer and the sub post spacer cannot be controlled precisely. A post spacer having a convex-shaped cross section is designed. That is, on a terminal surface of a normal post spacer, an extension portion having a smaller size is formed. The post spacer has a gradient such that when a display panel is compressed, a second gradient can abut against the array substrate so as to function as the sub post spacer. Comparing to the main post spacer and the sub post spacer which are manufactured independently, the structure does not require independently manufacturing a stepped portion to realize a level difference between the main post spacer and the sub post spacer in order to increase a pixel aperture ratio. However, a manufacturing process for the post spacer having a convex-shaped cross section requires two exposure processes. First, a first exposure process is applied to manufacture a sub post spacer having a first gradient, and then, a second exposure process is applied to manufacture a stepped portion on the sub post spacer in order to form a main post spacer having a second gradient. However, two exposure processes require two photo masks. Similarly, two exposure processes are required so that the manufacturing cost is still high.

SUMMARY OF THE INVENTION

In order to overcome the drawbacks of the prior art, the present invention provides a spacer and a manufacturing device for the same, which has a high pixel aperture ratio and an easy manufacturing process.

In order to achieve the above purpose, a technology solution adopted by the present invention is: a spacer manufacturing device, comprising: a photo mask having a central light-transmitting region and a peripheral light-transmitting region disposed at a periphery of the central light-transmitting region; and an exposure device right opposite to the photo mask; wherein light emitted from the exposure device is irradiated to a negative photoresist material after passing through the photo mask, the light intensity passing through the peripheral light-transmitting region is less than the light intensity passing through the central light-transmitting region.

The light transmittance of the central light-transmitting region is greater than the light transmittance of the peripheral light-transmitting region.

The peripheral light-transmitting region has multiple sub-light-transmitting regions and multiple light-shielding regions arranged alternately, and one of the multiple light-shielding regions separates the central light-transmitting region from the sub-light-transmitting regions.

The sub-light-transmitting regions and the light-shielding regions are all symmetric about a center, and symmetry centers of the sub-light-transmitting regions and the light-shielding regions are the same as a symmetry center of the central light-transmitting region.

The number of the photo mask is multiple, and the number of sub-light-transmitting regions of each photo mask is different.

The number of the photo mask is multiple, and widths of sub-light-transmitting regions of each photo mask are different.

The number of the photo mask is multiple, and widths of light-shielding regions of each photo mask are different.

The peripheral light-transmitting region is evenly distributed with multiple dotted sub-light-transmitting regions.

The device further includes an exposure regulation device for regulating irradiation parameters of the exposure device.

The exposure regulation device includes an exposure distance regulation module, an exposure angle regulation module and a timer.

Another purpose of the present invention is to provide a spacer, which is manufactured by the above spacer manufacturing device.

The spacer manufacturing device of the present invention disposes a central light-transmitting region and a peripheral light-transmitting region which having different light intensity on a same photo mask such that after the light emitted from the exposure device irradiates on the negative photoresist material, the light intensity at a center and the light intensity at a periphery are different so that a height of a spacer formed at the center region is greater than a height of a spacer formed at the periphery region. Accordingly, only one exposure process is required to realize the spacer having a convex-shaped cross section. The process is simple and the manufacturing cost is low. At the same time, the manufacturing device also includes multiple photo masks. A shape and a size of the peripheral light-transmitting region of each photo mask are different. Besides, a density and a width of the sub-light-transmitting regions can be increased or the irradiation parameters of the exposure device can be regulated to adjust a uniformity of the peripheral light-transmitting region of the photo mask. Finally, a flatness of the convex shoulder of the spacer having a convex-shaped cross section is adjustable, which can satisfy the requirement for manufacturing spacers having different specifications.

BRIEF DESCRIPTION OF THE DRAWINGS

FIG. 5a is a light intensity distribution diagram after irradiated through the mask shown in FIG. 4a;

DETAILED DESCRIPTION OF THE PREFERRED EMBODIMENT

The following content combines with the drawings and the embodiment for describing the present invention in detail. It is obvious that the following embodiments are only some embodiments of the present invention. For the person of ordinary skill in the art without creative effort, the other embodiments obtained thereby are still covered by the present invention.

Figure 1:
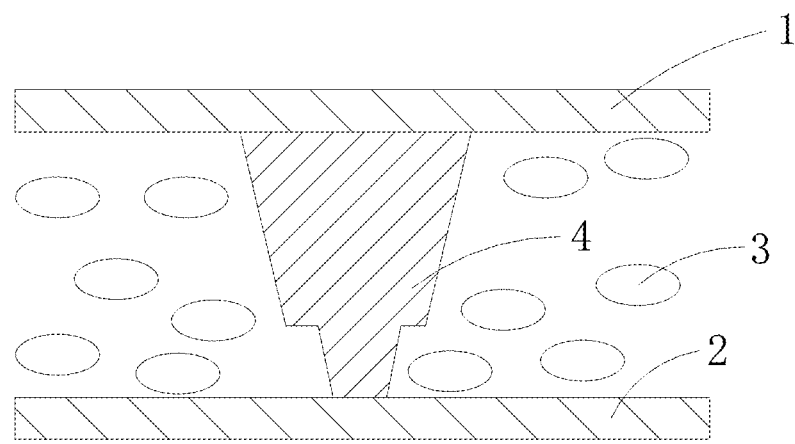
FIG. 1 is a schematic diagram of a display panel according to an embodiment of the present invention.

With reference to FIG. 1, the display panel of the present invention includes an upper color filter substrate 1, a lower array substrate 2, and liquid crystal molecules filled between the color filter substrate 1 and the array substrate 2. At the same time, a spacer 4 having a convex-shaped cross section is located between the color filter substrate 1 and the array substrate 2, and supports the color filter substrate 1 and the array substrate 2. Besides, the spacer 4 having a convex-shaped cross section has both functions of a main post spacer (PS) and a sub post spacer (PS). The spacer 4 having a convex-shaped cross section can be a stacked structure stacked by a cylindrical column, a cylindrical platform or a prismatic platform.

Figure 2:
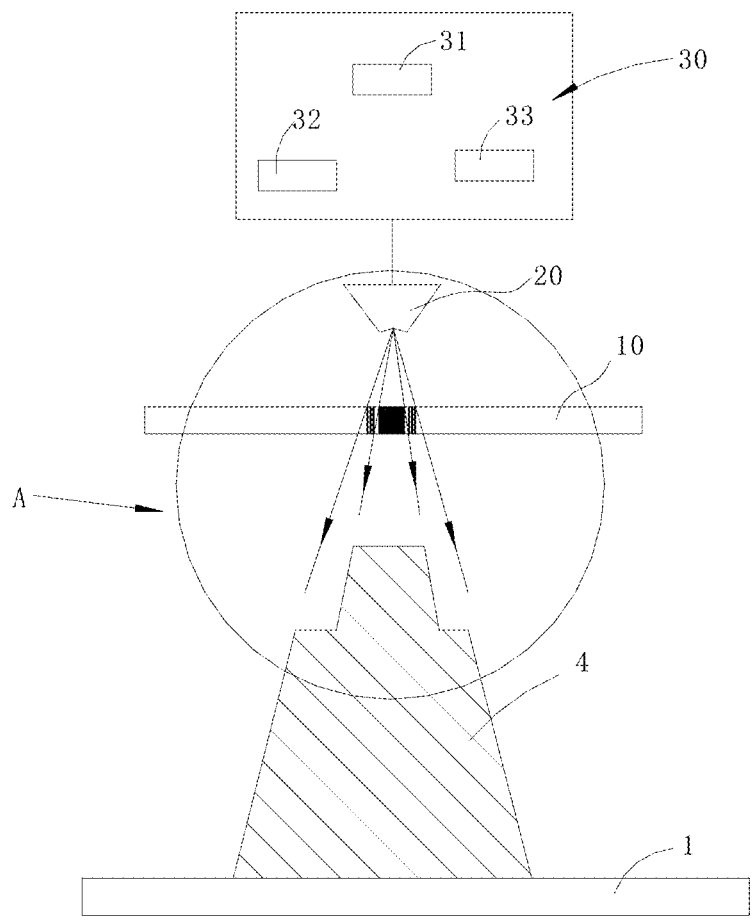
FIG. 2 is a schematic diagram of a spacer manufacturing device according to an embodiment of the present invention.
Figure 3:
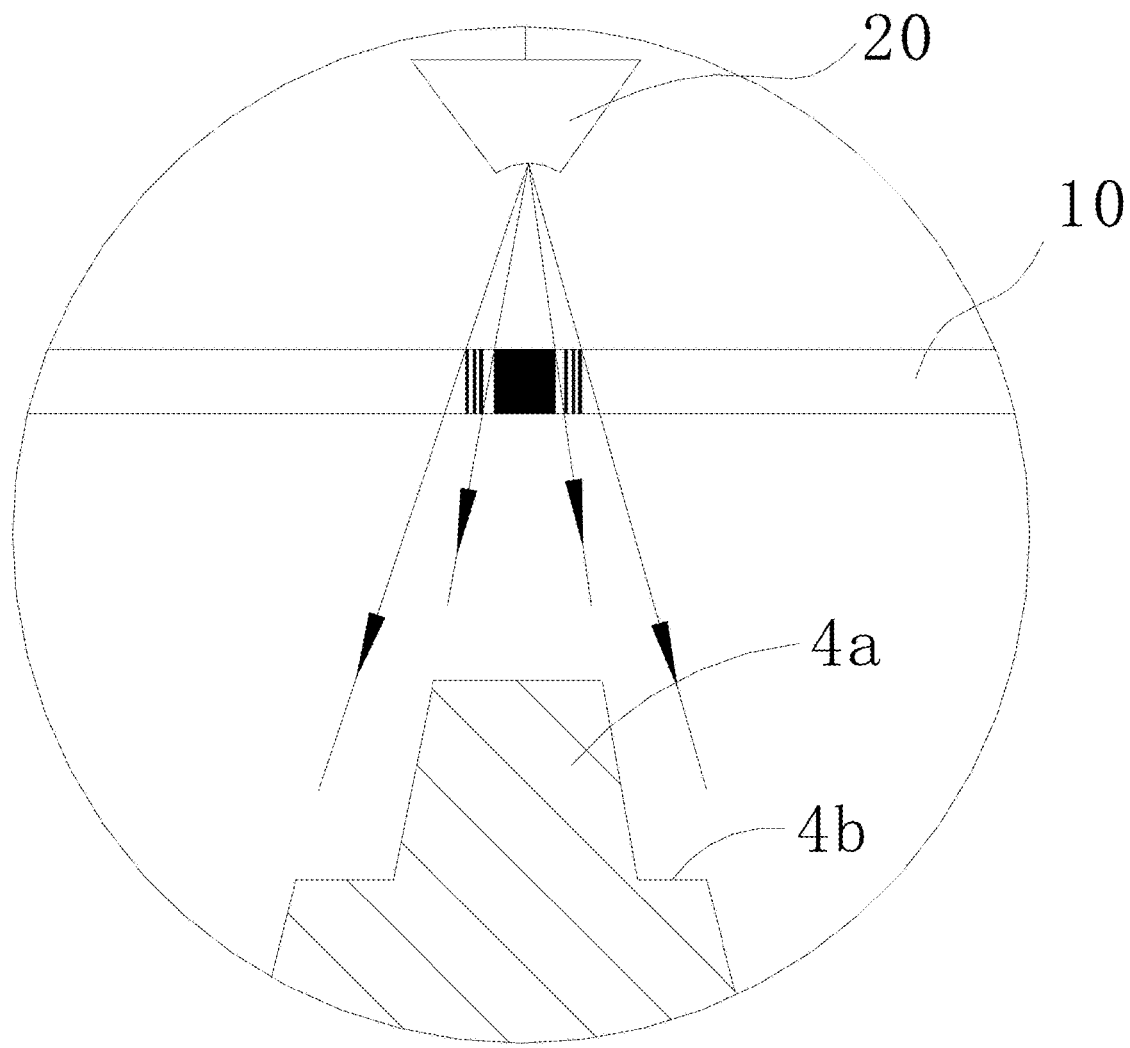
FIG. 3 is a portion enlarged diagram of the portion A in FIG. 2.

As shown in FIGS. 2 and 3, in order to manufacture the spacer 4 having a convex-shaped cross section, the embodiment of the present invention provides a spacer manufacturing device, including a photo mask 10, and an exposure device 20 right opposite to the photo mask 10. The color filter substrate 1 is coated with a negative photoresist material located below the photo mask 10. The lights emitted from the exposure device 20 irradiate a designated portion on the negative photoresist material after transmission through the photo mask 10. After the negative photoresist material is exposed and developed, removing a portion of the negative photoresist material that is not irradiated by the lights, a remaining portion of the negative photoresist material forms the spacer 4 after drying.

With combined reference to FIGS. 4a to 4d various kinds of the photo masks in different shapes are shown. The photo mask 10 of the present embodiment includes a central light-transmitting region 10a and a peripheral light-transmitting region 10b disposed at a periphery of the central light-transmitting region 10a. The other portion of the photo mask 10 cannot transmit light. When the light emitted from the exposure device 20 irradiates on the negative photoresist material after passing through the photo mask 10, the light intensity passing through the peripheral light-transmitting region 10b is less than the light intensity passing through the central light-transmitting region 10a.

The peripheral light-transmitting region 10b has multiple sub-light-transmitting regions 11 and multiple light-shielding regions 12 arranged alternately. One of the multiple light-shielding regions 12 separates the central light-transmitting region 10a from the sub-light-transmitting regions 11.

The sub-light-transmitting regions 11 and the light-shielding regions 12 of the present embodiment are all symmetric about a center, and symmetry centers of the sub-light-transmitting regions 11 and the light-shielding regions 12 are the same as a symmetry center of the central light-transmitting region 10a.

Figure 4A:
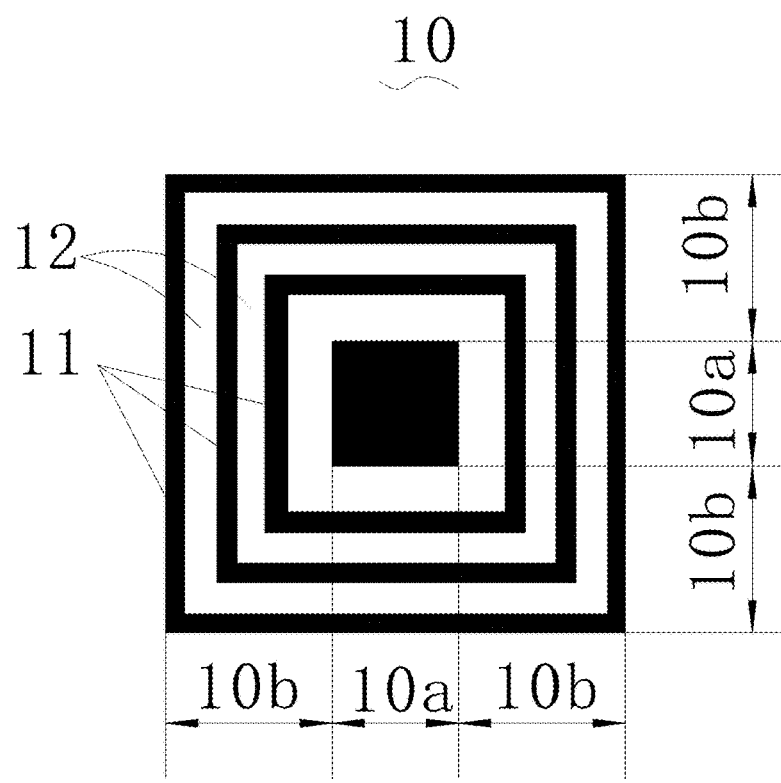
FIG. 4a is a schematic diagram of a photo mask according to an embodiment of the present invention.
Figure 4B:
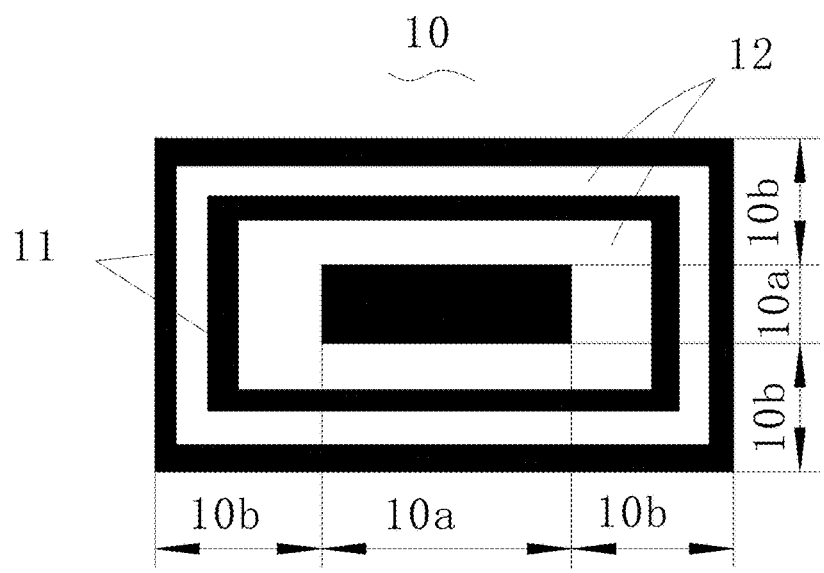
FIG. 4b is a schematic diagram of another photo mask according to an embodiment of the present invention.
Figure 4C:
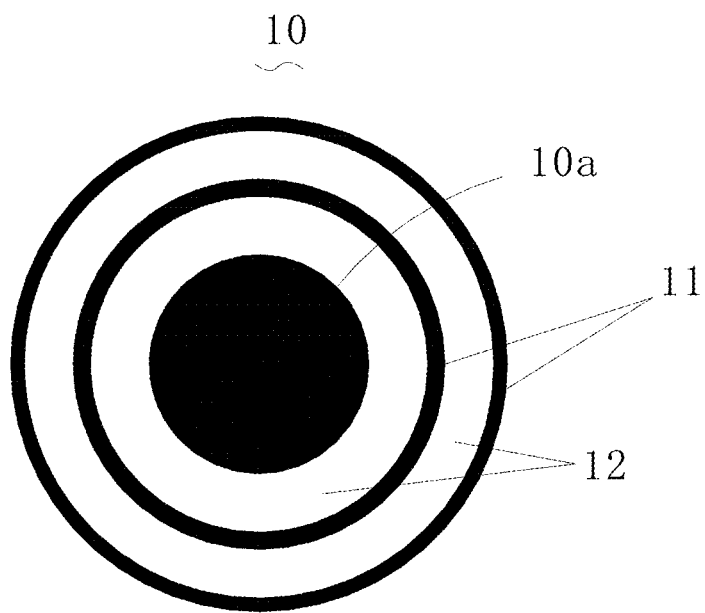
FIG. 4c is a schematic diagram of another photo mask according to an embodiment of the present invention.
Figure 4D:
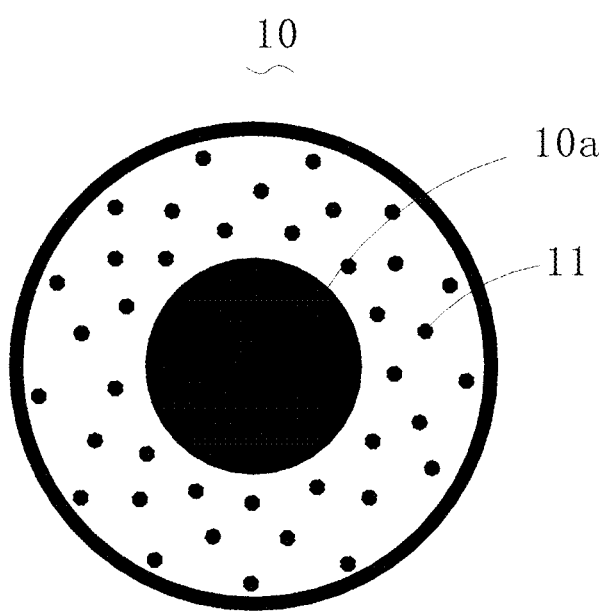
FIG. 4d is a schematic diagram of another photo mask according to an embodiment of the present invention.
Figure 5A:
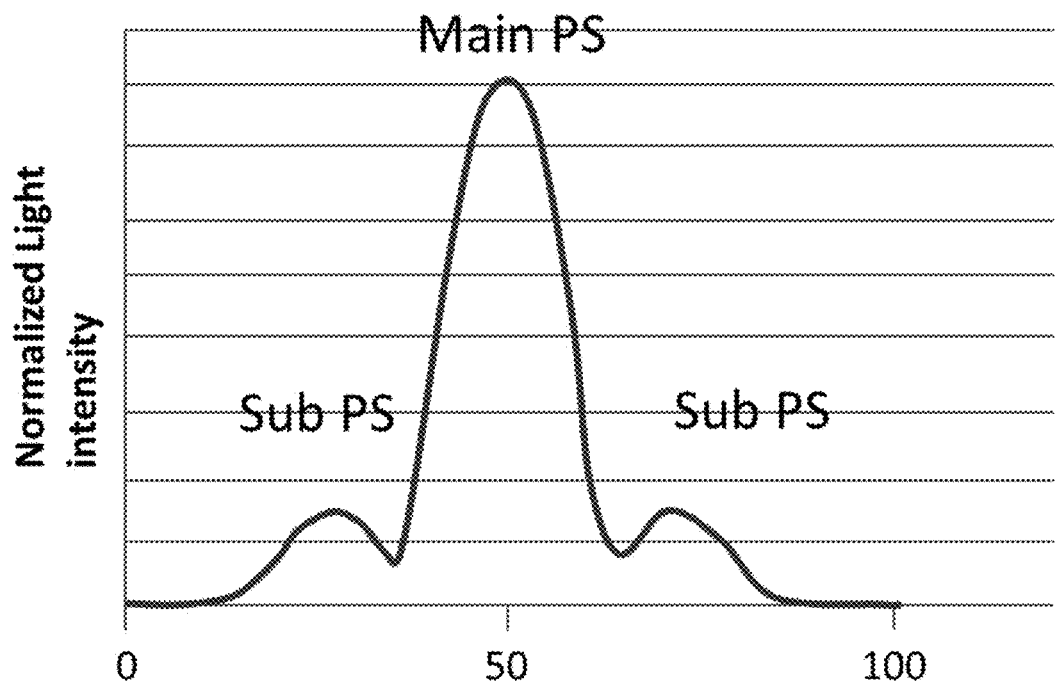
Figure 5B:
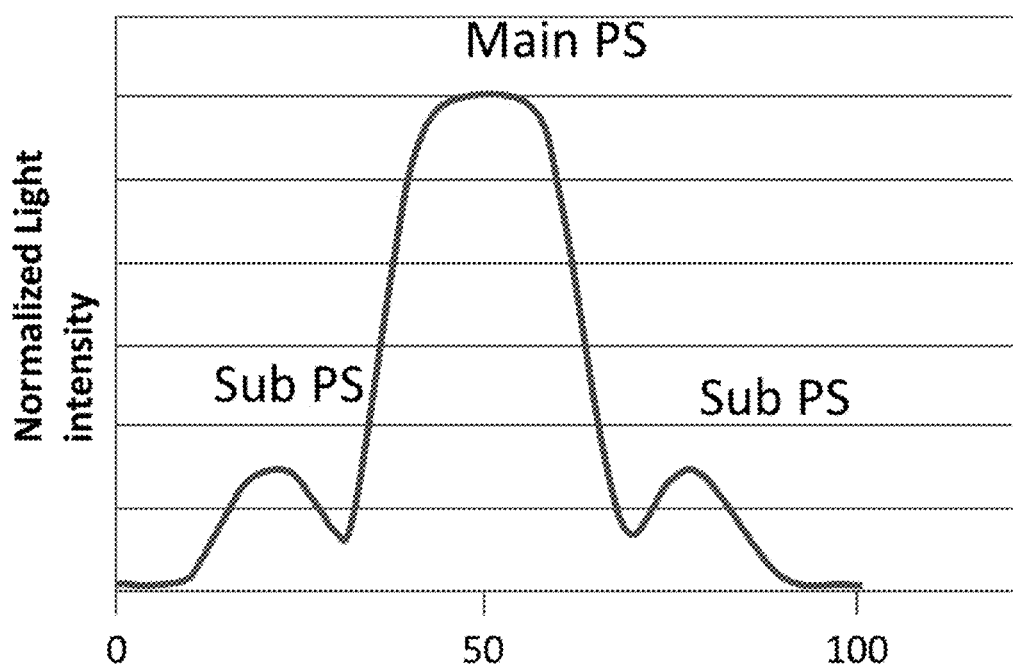
FIG. 5b is a light intensity distribution diagram after irradiated through the mask shown in FIG. 4b.
Figure 5C:
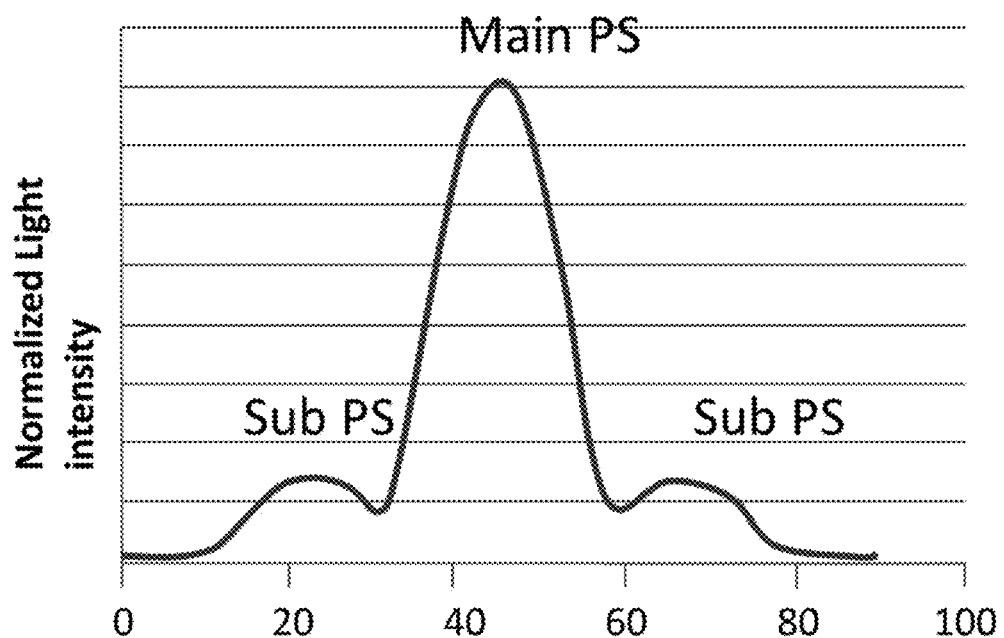
FIG. 5c is a light intensity distribution diagram after irradiated through the mask shown in FIG. 4c.
Figure 5D:
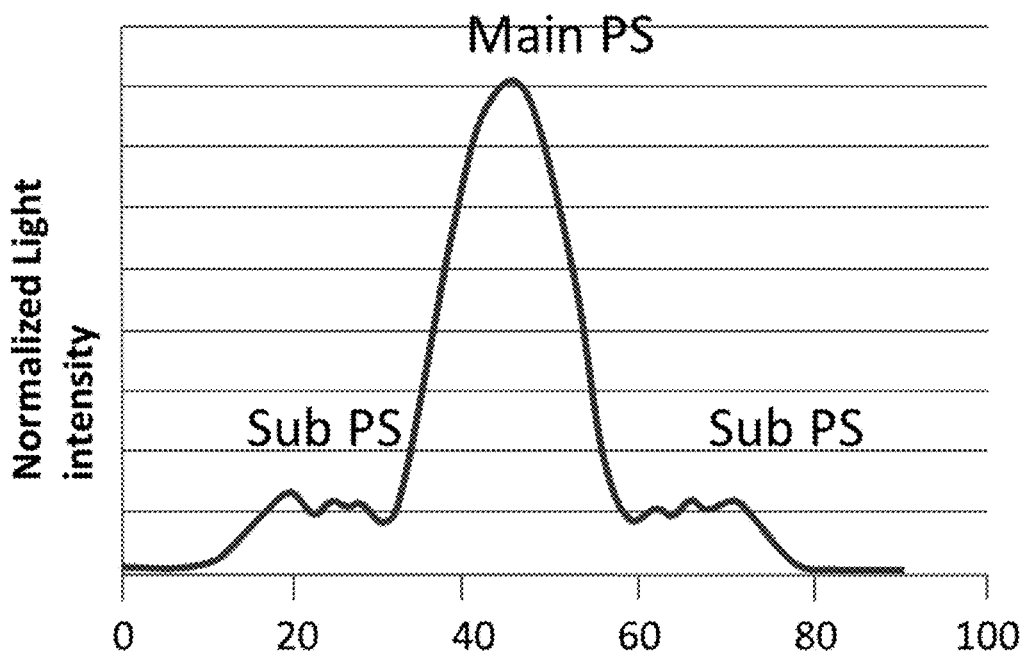
FIG. 5d is a light intensity distribution diagram after irradiated through the mask shown in FIG. 4d.

In FIG. 4a, the central light-transmitting region 10a is a solid square. Each of the sub-light-transmitting regions 11 and the light-shielding regions 12 is a square-frame structure. In FIG. 4b, the central light-transmitting region 10a is a solid rectangle. Each of the sub-light-transmitting regions 11 and the light-shielding regions 12 is a rectangle-frame structure. In FIG. 4c, the central light-transmitting region 10a is a solid circle. Each of the sub-light-transmitting regions 11 and the light-shielding regions 12 is a circular structure. In FIG. 4d, the central light-transmitting region 10a is a solid circle. Each of the sub-light-transmitting regions 11 and the light-shielding regions 12 is a solid circular dot. The peripheral light-transmitting region 10b is evenly distributed with the dotted sub-light-transmitting regions 11. It can be understood that the structure of the photo mask of the present invention is not limited to the above shapes. In the manufacturing process, shapes of the central light-transmitting region 10a, the sub-light-transmitting regions 11 and the light-shielding regions 12 can be selected according to an actual requirement. The only requirement is that the symmetry centers of the central light-transmitting region 10a, the sub-light-transmitting regions 11 and the light-shielding regions 12 are the same.

A height of a post spacer depends on the light intensity distribution in an exposure process, the light intensity passing through the central light-transmitting region 10a is stronger, after irradiating the negative photoresist material, a main spacer portion 4a having a higher height (that is, the Main PS) is formed. The light intensity passing through the peripheral light-transmitting region 10b is weaker, after irradiating a periphery of the negative photoresist material, a sub spacer portion 4b having a lower height (that is, the Sub PS) is formed.

Through use of Athena software with an exposure simulation module (also known as an "Optolith" for one person skilled in the art) for performing a simulation and verification to different photo mask structures, light intensity distributions of different spacer design methods are simulated. FIGS. 5a to 5d respectively simulate and show light intensity distribution diagrams corresponding to photo mask structures shown in FIGS. 4a to 4d. As shown, the light intensity distribution of the central light-transmitting region 10a is higher than the other regions. A level difference between the main spacer portion 4a and the sub spacer portion 4b can be controlled through a light-transmitting area ratio of the central light-transmitting region 10a to the peripheral light-transmitting region 10b of the photo mask 10. When a light-transmitting area of the peripheral light-transmitting region 10b is larger, the level difference is smaller. At the same time, when the light-shielding regions 12 of the peripheral light-transmitting region 10b is narrower, and the number of layers of the sub-light-transmitting regions 11 is more, a surface of a transitional convex shoulder between the main spacer portion 4a and the sub spacer portion 4b is smoother.

At the same time, the spacer manufacturing device 20 also includes an exposure regulation device 30 for regulating irradiation parameters of the exposure device 20. In the spacer manufacturing process, because light emitted from the exposure device 20 is not completely parallel, a certain amount of divergence exists. Therefore, in the exposure process, a portion of the negative photoresist material right opposite to an interspace is also irradiated by an ultraviolet light. Finally, the exposure effect is not in an ideal design status. Therefore, as shown in FIG. 2, in the present embodiment, the exposure regulation device 30 includes an exposure distance regulation module 31, an exposure angle regulation module 32 and a timer 33, which can respectively control parameters of an exposure distance, an exposure angle and an exposure time of the exposure device 20. Through controlling the exposure distance between the exposure device 20 and the photo mask 10, the exposure angle of the exposure device 20, the light intensity of light passing through the peripheral light-transmitting region 10b is evenly distributed. Combining with controlling the exposure time, flatness of the convex shoulder of the spacer is consistent.

In the spacer design process, in order to realize a multi-level gradient on the spacer having a convex-shaped cross section, a convex shoulder of the spacer should be designed as a wavy shape or a surface having a gradually changed height. The number of the sub-light-transmitting regions 11 of the photo mask 10 is designed to be at least two. In the manufacturing process, the exposure parameters are slightly regulated by the exposure regulation device 30.

In order to regulate the flatness of the convex shoulder of the spacer conveniently so as to increase diversity of the function of the exposure device 20, the spacer manufacturing device of the present embodiment is provided with multiple photo masks 10 which are convenient for replacing. For each photo mask 10, the number of the sub-light-transmitting regions 11, a width of each sub-light-transmitting region 11 and a shape of each sub-light-transmitting region 11 are different. Besides, a width of the light-shielding region 12 of each photo mask 10 is different. The photo masks can be selected freely in the manufacturing process.

In another embodiment, the light transmittance of the central light-transmitting region 10a is greater than the light transmittance of the peripheral light-transmitting region 10b to realize a light-transmitting difference between the central light-transmitting region 10a and the peripheral light-transmitting region 10b. Therefore, the level difference between the main spacer portion 4a and the sub spacer portion 4b is realized.

The spacer manufacturing device of the present invention disposes a central light-transmitting region and a peripheral light-transmitting region which having different light intensity on a same photo mask such that after the lights emitted from the exposure device irradiates on the negative photoresist material, the light intensity at a center and the light intensity at a periphery are different so that a height of a spacer formed at the center region is greater than a height of a spacer formed at the periphery region. Accordingly, only one exposure process is required to realize the spacer having a convex-shaped cross section. The process is simple and the manufacturing cost is low. At the same time, the manufacturing device also includes multiple photo masks. A shape and a size of the peripheral light-transmitting region of each photo mask are different. Besides, a density and a width of the sub-light-transmitting regions can be increased or the irradiation parameters of the exposure device can be regulated to adjust a uniformity of the peripheral light-transmitting region of the photo mask. Finally, a flatness of the convex shoulder of the spacer having a convex-shaped cross section is adjustable, which can satisfy the requirement for manufacturing spacers having different specifications.

What is claimed is:

1. A spacer manufacturing device, comprising:
   a photo mask having a central light-transmitting region and a peripheral light-transmitting region disposed at a periphery of the central light-transmitting region; and
   an exposure device opposite to the photo mask;
   wherein light emitting from the exposure device irradiates a negative photoresist material after passing through the photo mask, and light intensity passing through the peripheral light-transmitting region is less than light intensity passing through the central light-transmitting region;
   wherein the peripheral light-transmitting region includes multiple sub-light-transmitting regions and multiple light-shielding regions arranged alternately, and one of the multiple light-shielding regions separates the central light-transmitting region from the sub-light-transmitting regions;
   wherein the central light-transmitting region is a solid circle, and each of the multiple sub-light-transmitting regions and the multiple light-shielding regions is a circular structure;
   wherein the sub-light-transmitting regions and the light-shielding regions are all symmetric about a center, and symmetry centers of the sub-light-transmitting regions and the light-shielding regions are the same as a symmetry center of the central light-transmitting region; and wherein the number of the photo mask is multiple, and widths of sub-light-transmitting regions of each photo mask are different.

2. The spacer manufacturing device according to claim 1 further comprising an exposure regulation device that regulates irradiation parameters of the exposure device.

3. The spacer manufacturing device according to claim 2, wherein the exposure regulation device comprises an exposure distance regulation module, an exposure angle regulation module, and a timer.

4. A spacer which is manufactured by a spacer manufacturing device, wherein the spacer manufacturing device comprises a photo mask having a central light-transmitting region and a peripheral light-transmitting region disposed at a periphery of the central light-transmitting region; and an exposure device opposite to the photo mask; wherein light emitting from the exposure device irradiates a negative photoresist material after passing through the photo mask, and light intensity passing through the peripheral light-transmitting region is less than light intensity passing through the central light-transmitting region;

wherein the peripheral light-transmitting region includes multiple sub-light-transmitting regions and multiple light-shielding regions arranged alternately, and one of the multiple light-shielding regions separates the central light-transmitting region from the sub-light-transmitting regions;

wherein the central light-transmitting region is a solid circle, and each of the multiple sub-light-transmitting regions and the multiple light-shielding regions is a circular structure;

wherein the sub-light-transmitting regions and the light-shielding regions are all symmetric about a center, and symmetry centers of the sub-light-transmitting regions and the light-shielding regions are the same as a symmetry center of the central light-transmitting region; and wherein the number of the photo mask is multiple, and widths of sub-light-transmitting regions of each photo mask are different.

5. The spacer according to claim 4, wherein the spacer manufacturing device further comprises an exposure regulation device that regulates irradiation parameters of the exposure device.

6. The spacer according to claim 5, wherein the exposure regulation device comprises an exposure distance regulation module, an exposure angle regulation module and a timer.

* * * * *